「(12) United States Patent
Jung et al.

(10) Patent No.: US 8,269,854 B2
(45) Date of Patent: Sep. 18, 2012

(54) IMAGE SENSOR WITH ADJUSTED GAINS IN ACTIVE AND BLACK PIXELS

(75) Inventors: Sang-Il Jung, Seoul (KR); Young-Hoon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 896 days.

(21) Appl. No.: 12/291,910

(22) Filed: Nov. 14, 2008

(65) Prior Publication Data

US 2009/0160971 A1    Jun. 25, 2009

(30) Foreign Application Priority Data

Nov. 15, 2007    (KR) .................. 10-2007-0116590

(51) Int. Cl.
    *H04N 5/235* (2006.01)
(52) U.S. Cl. ..................................... 348/229.1; 348/308
(58) Field of Classification Search ............... 348/229.1, 348/308
    See application file for complete search history.

(56) References Cited

U.S. PATENT DOCUMENTS

| 2003/0184666 A1* | 10/2003 | Jo ................................. 348/308 |
| 2005/0001246 A1* | 1/2005 | Mouli ........................... 257/291 |
| 2006/0208285 A1* | 9/2006 | Inoue et al. .................... 257/239 |
| 2006/0261431 A1* | 11/2006 | Kim et al. ..................... 257/462 |
| 2008/0218615 A1* | 9/2008 | Huang et al. .................. 348/294 |

OTHER PUBLICATIONS

Korean Patent Application No. 1020050075681 to Lee et al., having Publication date of Feb. 23, 2007 (w/ English Abstract page).
Korean Patent Application No. 1020050117855 to Lee et al., having Publication date of Jun. 12, 2007 (w/ English Abstract page).
Japanese Patent Application No. 2004-201015 to Yasujiro et al., having Publication date of Jan. 26, 2006 (w/ English Abstract page).

* cited by examiner

*Primary Examiner* — Usman Khan
(74) *Attorney, Agent, or Firm* — Monica H. Choi

(57) ABSTRACT

An image sensor includes an active pixel and a black pixel. The active pixel has a first signal gain and a first dark signal level, and the black pixel has a second signal gain and a second dark signal level. At least one of the first and second signal gains is adjusted such that the first and second dark signal levels are substantially equal for minimizing image defects in the image sensor.

18 Claims, 14 Drawing Sheets

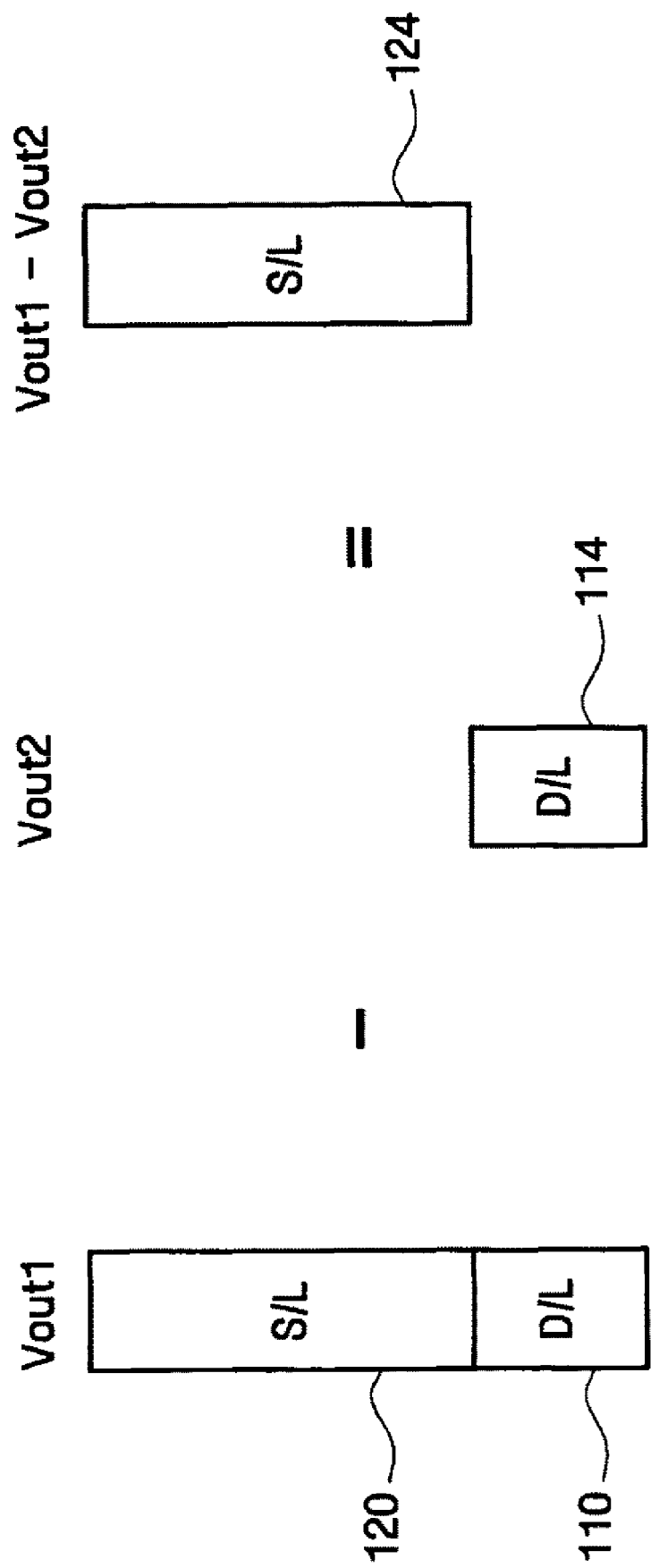

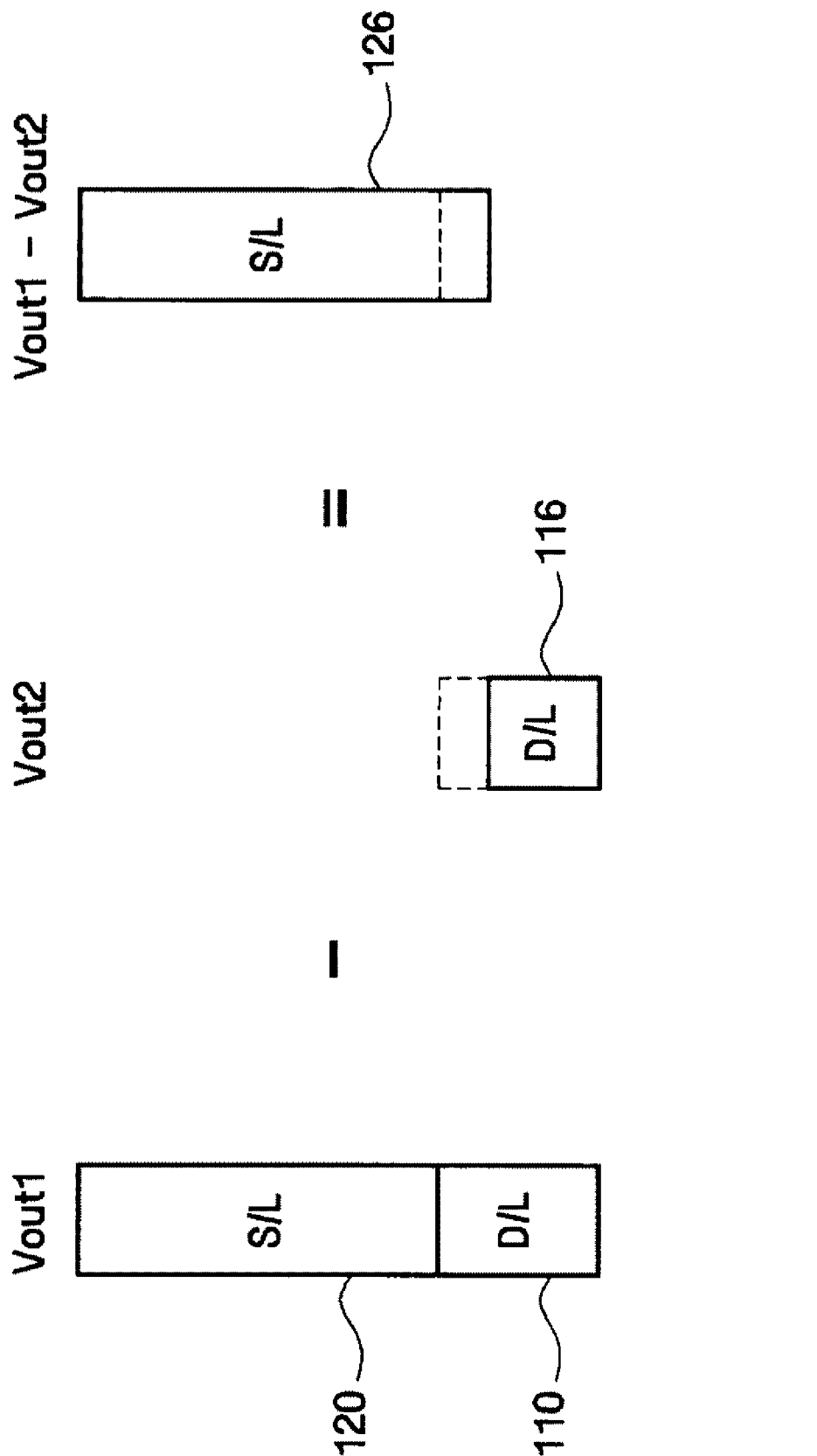

IMAGE SENSOR WITH ADJUSTED GAINS IN ACTIVE AND BLACK PIXELS

BACKGROUND OF THE INVENTION

This application claims priority under 35 USC §119 to Korean Patent Application No. 10-2007-0116590, filed on Nov. 15, 2007 in the Korean Intellectual Property Office, the disclosure of which is incorporated herein in its entirety by reference.

1. Field of the Invention

The present invention relates generally to image sensors, and more particularly to an image sensor with adjusted signal gains in the active and black pixels.

2. Background of the Invention

An image sensor converts an optical image into electric signals. Recent developments in computers and telecommunications result in great demand for image sensors with improved performance such as for use in digital cameras, camcorders, personal communication systems (PCSs), gaming devices, security cameras, medical microcameras, and robots.

Metal-oxide semiconductor (MOS) image sensors are easy to drive using various scanning methods. In addition, a signal processor is easily integrated into a MOS image sensor as a single chip such that the MOS image sensor may be miniaturized with reduced manufacturing cost using typical MOS fabrication processes. Furthermore, power consumption of a MOS image sensor is generally low such that the MOS image sensor is amenable for use in devices with limited battery capacity. Accordingly, use of MOS image sensors capable of realizing high resolution has dramatically increased.

A MOS image sensor includes an active pixel region having a plurality of active pixels and an optical black region having a plurality of black pixels. Photoelectric converters of the active pixels generate charge from photoelectric conversion of light and also from thermal energy. In contrast, photoelectric converters of the black pixels generate charge from only thermal energy since light is shielded by a light shield layer formed over the black pixels.

Such charge generated by a black pixel as represented by a respective voltage signal is subtracted from the total charge generated by a corresponding active pixel as represented by a respective voltage signal for determining the amount of charge generated by photoelectric conversion in the active pixel. For example, an auto dark-level compensation circuit (ADLC) performs subtraction on such respective voltage signals to generate a digital image signal corresponding to the amount of charge generated by photoelectric conversion.

The subtraction result is desired to eliminate a dark signal level generated from thermal energy in the active pixel.

SUMMARY OF THE INVENTION

Accordingly, an image sensor of embodiments of the present invention have at least one signal gain of the active and black pixels adjusted for completely subtracting away the dark signal level of the active pixel.

An image sensor according to an aspect of the present invention includes an active pixel and a black pixel. The active pixel has a first signal gain and a first dark signal level, and the black pixel has a second signal gain and a second dark signal level. At least one of the first and second signal gains is adjusted such that the first and second dark signal levels are substantially equal.

In an example embodiment of the present invention, the first and second signal gains are adjusted to be different such that the first and second dark signal levels are substantially equal. For example, the second signal gain is adjusted to be different from the first signal gain such that the first and second dark signal levels are substantially equal.

In an example embodiment of the present invention, the second signal gain is adjusted to be less than the first signal gain when the second dark signal level is higher than the first dark signal level before the adjustment of the signal gains. Alternatively, the second signal gain is adjusted to be higher than the first signal gain when the second dark signal level is lower than the first dark signal level before the adjustment of the signal gains.

In a further embodiment of the present invention, the first signal gain is a first source-follower gain of a first source-follower transistor of the active pixel, and the second signal gain is a second source-follower gain of a second source-follower transistor of the black pixel.

In another embodiment of the present invention, the first source-follower transistor is formed in a semiconductor substrate, and the second source-follower transistor is formed in a well within the semiconductor substrate. In that case, the semiconductor substrate has a first dopant concentration that is different from a second dopant concentration of the well. For example, the second dopant concentration is higher than the first dopant concentration with the semiconductor substrate and the well having P-type conductivity when the first and second source-follower transistors are N-channel field effect transistors.

In an alternative embodiment of the present invention, the first source-follower transistor is formed in a first well with a first dopant concentration, and the second source-follower transistor is formed in a second well with a second dopant concentration with the first and second dopant concentrations being different. For example, the second dopant concentration is higher than the first dopant concentration with the first and second wells having P-type conductivity when the first and second source-follower transistors are N-channel field effect transistors.

In a further embodiment of the present invention, the first source-follower transistor has a first channel dopant concentration that is different from a second channel dopant concentration of the second source-follower transistor.

In another embodiment of the present invention, the active pixel includes a first photoelectric converter, a first transmission transistor, a first selection transistor, and a first reset transistor. The first transmission transistor is coupled between the first photoelectric converter and a first floating diffusion node at a first gate of the first source-follower transistor. The first selection transistor is coupled between the first source-follower transistor and a first output line. The first reset transistor is coupled between the first floating diffusion node and a power voltage source.

In addition, the black pixel includes a second photoelectric converter, a second transmission transistor, a second selection transistor, and a second reset transistor. The second transmission transistor is coupled between the second photoelectric converter and a second floating diffusion node at a second gate of the second source-follower transistor. The second selection transistor is coupled between the second source-follower transistor and a second output line. The second reset transistor is coupled between the second floating diffusion node and the power voltage source.

An image sensor according to another aspect of the present invention includes an active pixel and a black pixel having a semiconductor substrate, a well, and a respective source-follower transistor. The semiconductor substrate and the well are of a first conductivity type with the well being formed within the semiconductor substrate. The respective source-follower transistor of the black pixel is formed in the well. For example, the well and the semiconductor substrate have P-type conductivity when the respective source-follower transistor of the black pixel is an N-channel field effect transistor.

In an example embodiment of the present invention, the well has a higher P-type dopant concentration than the semiconductor substrate.

In another embodiment of the present invention, the active pixel includes another respective source-follower transistor formed in the semiconductor substrate. In that case, the respective source-follower transistor of the black pixel has a respective signal gain that is different from a respective signal gain of the respective source-follower transistor of the active pixel.

For example, the respective signal gain in the black pixel is lower than the respective signal gain in the active pixel when the black pixel has a higher dark signal level than that of the active pixel with the signal gains being equal. Alternatively, the respective signal gain in the black pixel is higher than the respective signal gain in the active pixel when the black pixel has a lower dark signal level than that of the active pixel with the signal gains being equal.

In this manner, the signal gains of the active and black pixels are adjusted by design of the respective source-follower transistors for equalizing the dark signal levels of the active and black pixels.

BRIEF DESCRIPTION OF THE DRAWINGS

The above and other features and advantages of the present invention will become more apparent when described in detailed exemplary embodiments thereof with reference to the attached drawings in which:

FIGS. 4A, 4B, and 4C illustrate signal levels comprising first and second output voltage signals generated by active and black pixels of an image sensor;

The figures referred to herein are drawn for clarity of illustration and are not necessarily drawn to scale. Elements having the same reference number in FIGS. 1, 2, 3, 4A, 4B, 4C, 5A, 5B, 6, 7, 8, 9, 10, and 11 refer to elements having similar structure and/or function.

DETAILED DESCRIPTION OF THE INVENTION

Figure 1:
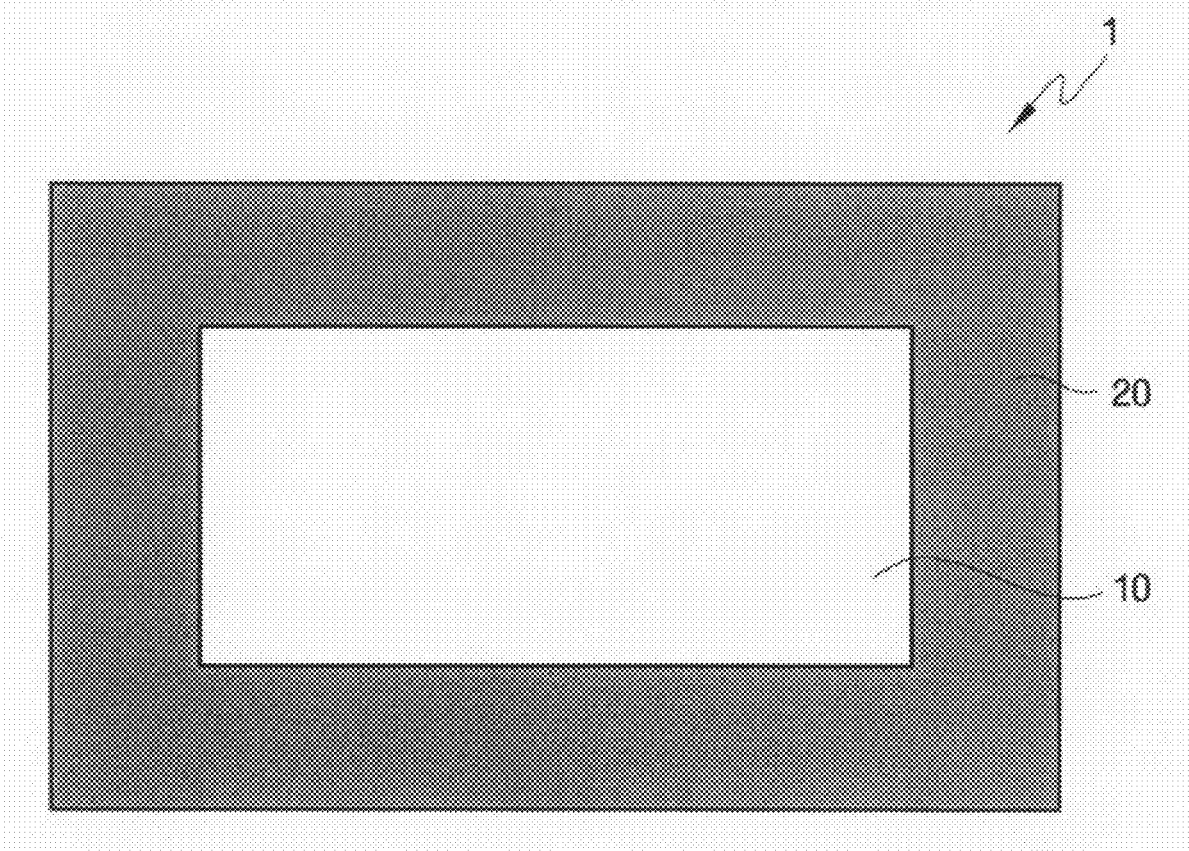
FIG. 1 shows a block diagram of a pixel array of an image sensor, according to an embodiment of the present invention.

The present invention is now described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It should be understood that, although the terms first, second, and others may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It should be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having the meaning that is consistent with their meaning in the context of the relevant art and will not be interpreted in an idealized or overly formal sense unless expressly so defined herein.

Furthermore, relative terms such as "below," "beneath," or "lower", "above," and "upper" may be used herein to describe one element's relationship to another element as illustrated in the accompanying drawings. It will be understood that relative terms are intended to encompass different orientations of the device in addition to the orientation depicted in the accompanying drawings.

For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" may encompass both an orientation of above and below.

In embodiments of the present invention, an image sensor is illustrated and described as a complementary metal oxide semiconductor (CMOS) image sensor. However, the present invention may also be applied to an image sensor having N-channel metal oxide semiconductor (NMOS) transistors or P-channel metal oxide semiconductor (PMOS) transistors, or to other types of image sensors.

Figure 2:
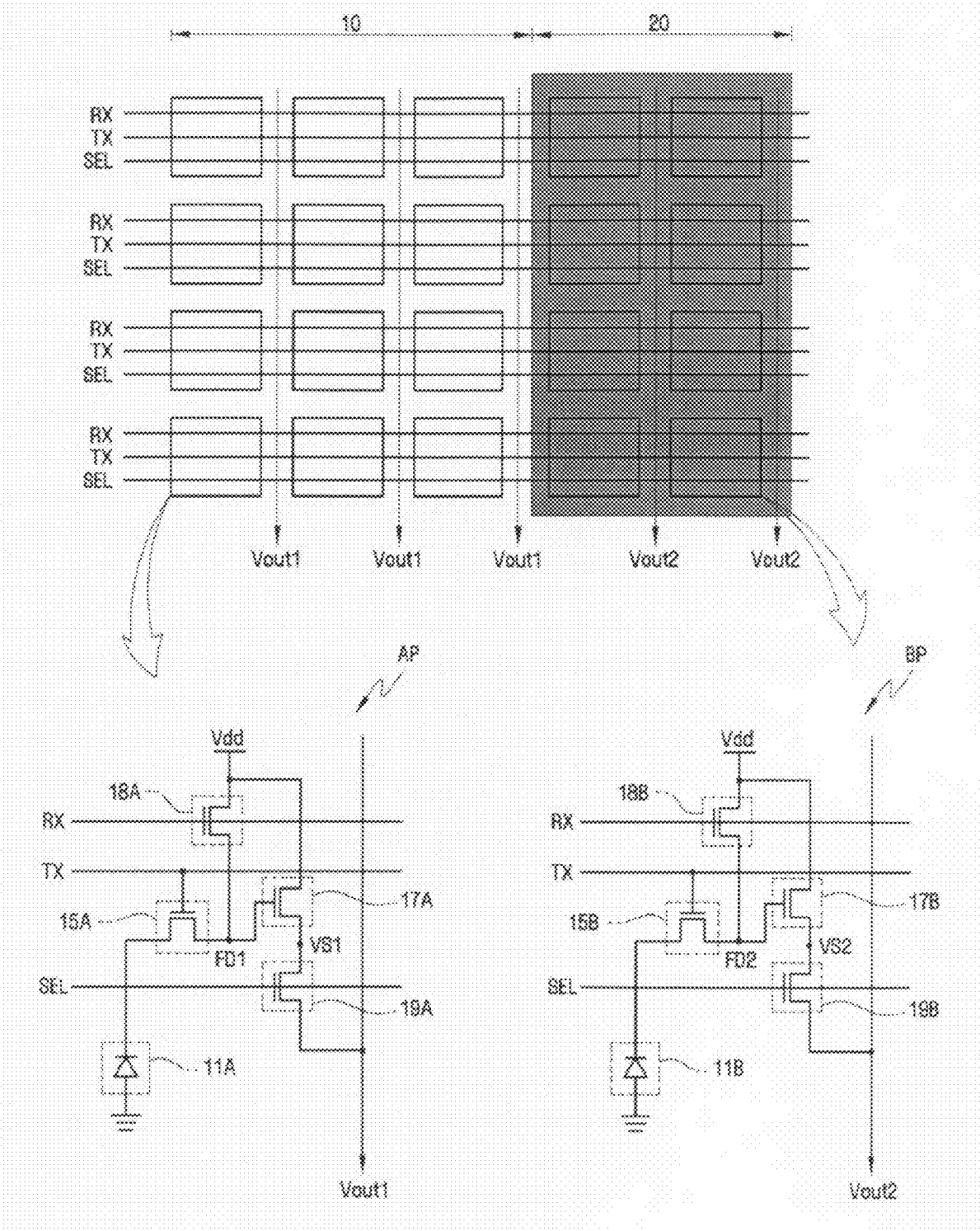
FIG. 2 shows a more detailed block diagram and circuit diagram of example active and black pixels in the image sensor of FIG. 1, according to an embodiment of the present invention.

FIG. 1 show a block diagram of a pixel array of an image sensor 1 according to an embodiment of the present invention. FIG. 2 shows a more detailed block diagram and circuit diagram of example active and black pixels in the pixel array of the image sensor 1 of FIG. 1, according to an embodiment of the present invention.

Referring to FIG. 2, each active pixel AP or each black pixel BP includes four transistors. However, the present invention is not restricted thereto, and the present invention may be applied to image sensors with each pixel having any number of transistors.

Referring to FIGS. 1 and 2, the pixel array of the image sensor 1 includes an active pixel region 10 and an optical black region 20. In the example of FIG. 1, the optical black region 20 surrounds all four sides of the active pixel region 10. However, the present invention is not restricted thereto, and the present invention may be practiced with the optical black region being disposed on only one side or two sides of the active pixel region 10.

The active pixel region 10 includes a plurality of active pixels (AP) each generating a respective first output voltage signal Vout1 in response to light reaching the active pixel. Each active pixel AP includes a respective first photoelectric converter 11A, a respective first transmission transistor 15A, a respective first source-follower transistor 17A, a respective first reset transistor 18A, and a respective first selection transistor 19A.

The first photoelectric converter 11A generates and accumulates charge from photoelectric conversion of light reaching the first photoelectric converter 11A. The first photoelectric converter 11A may include a photodiode, a phototransistor, a photogate, a pinned photodiode, or a combination thereof.

The first transmission transistor 15A transmits the charge accumulated in the first photoelectric converter 11A to a first detection node FD1 in response to a transmission signal TX. The first detection node FD1 is electrically floated and is thus also referred to as a first floating diffusion node. The first detection node FD1 has a parasitic capacitance that accumulates charge stored therein.

The first reset transistor 18A periodically resets the first detection node FD1. The first reset transistor 18A is coupled between a power voltage source that provides a predetermined voltage such as a power supply voltage VDD that is applied to the first detection node FD1 for reset. The first reset transistor 18A is driven according to a reset signal RX applied at a gate of the first reset transistor 18A. When the first reset transistor 18A is turned on in response to the reset signal RX, the power supply voltage VDD is transmitted to the first detection node FD1 that is then reset.

The first source-follower transistor 17A generates a first output voltage signal Vout1 in response to a voltage at the first detection node FD1 to a first output line through the first selection transistor 18A. Specifically, a current source (not shown) is coupled to such an output node, and the first source-follower transistor 17A has a uniform current flowing therethrough when the first selection transistor 18A is turned on.

Therefore, a source voltage VS1 of the first source-follower transistor 17A varies in proportion to a gate voltage of the first source-follower transistor 17A, i.e., the voltage of the first detection node FD1. The first source-follower transistor 17A generates the source voltage VS1 to the first output line having the first output voltage signal Vout1 generated thereon.

The first selection transistor 19A is used for selecting the corresponding active pixel AP to generate the first output voltage signal Vout1. The first selection transistor 19A is coupled between the first source-follower transistor 17A and the output line. The first selection transistor 19A is driven by a selection signal SEL applied at a gate of the first selection transistor 19A.

The optical black region 20 includes a plurality of black pixels (BP) each generating a respective second output voltage signal Vout2 corresponding to the amount of thermally generated charge. Each black pixel BP includes a respective second photoelectric converter 11B, a respective second transmission transistor 15B, a respective second source-follower transistor 17B, a respective second reset transistor 18B, and a respective second selection transistor 19B.

Such components of each black pixel BP have similar structure and function as the active pixel AP except that each black pixel BP is shielded from light. Thus, a detailed description of such components of the black pixel BP is not repeated herein. The use of the optical black region 20 is now described in more detail.

The first photoelectric converter 11A generates charge from both of photoelectric conversion of light and also from thermal energy, and such charge is represented by the first output voltage signal Vout1. In contrast, the second photoelectric converter 11B generates charge only from thermal energy since a light shield layer shields light from the second photoelectric converter 11B, and such charge is represented by the second output voltage signal Vout2. The amount of charge generated by the photoelectric conversion of light in the active pixel AP is desired to be determined.

Figure 11:
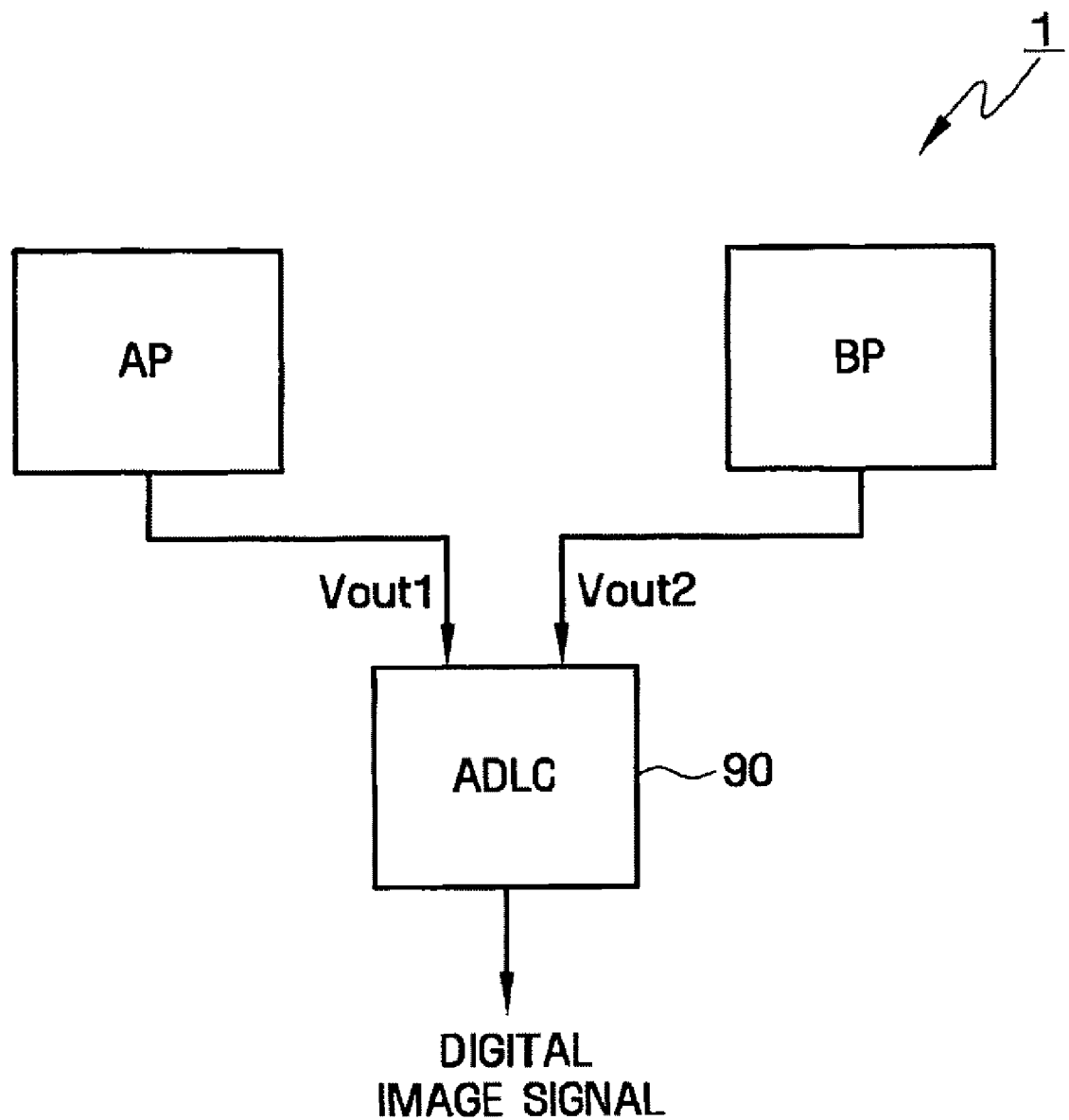
FIG. 11 shows a block diagram with a further component in the image sensor of FIG. 2, according to an embodiment of the present invention.

To that end referring to FIG. 11, the image sensor 1 further includes an auto dark level compensation circuit (ADLC) 90 that subtracts the second output voltage signal Vout2 from the first output voltage signal Vout1. The ADLC 90 digitizes the subtraction result to generate a digital image signal corresponding to the amount of charge generated by the photoelectric conversion of light by the first photoelectric converter 11A of the active pixel AP.

In summary, the optical black region 20 with the black pixels is used for eliminating the component of thermally generated charge and/or the component from offset in the first and second photoelectric converters 11A and 11B.

Figure 3:
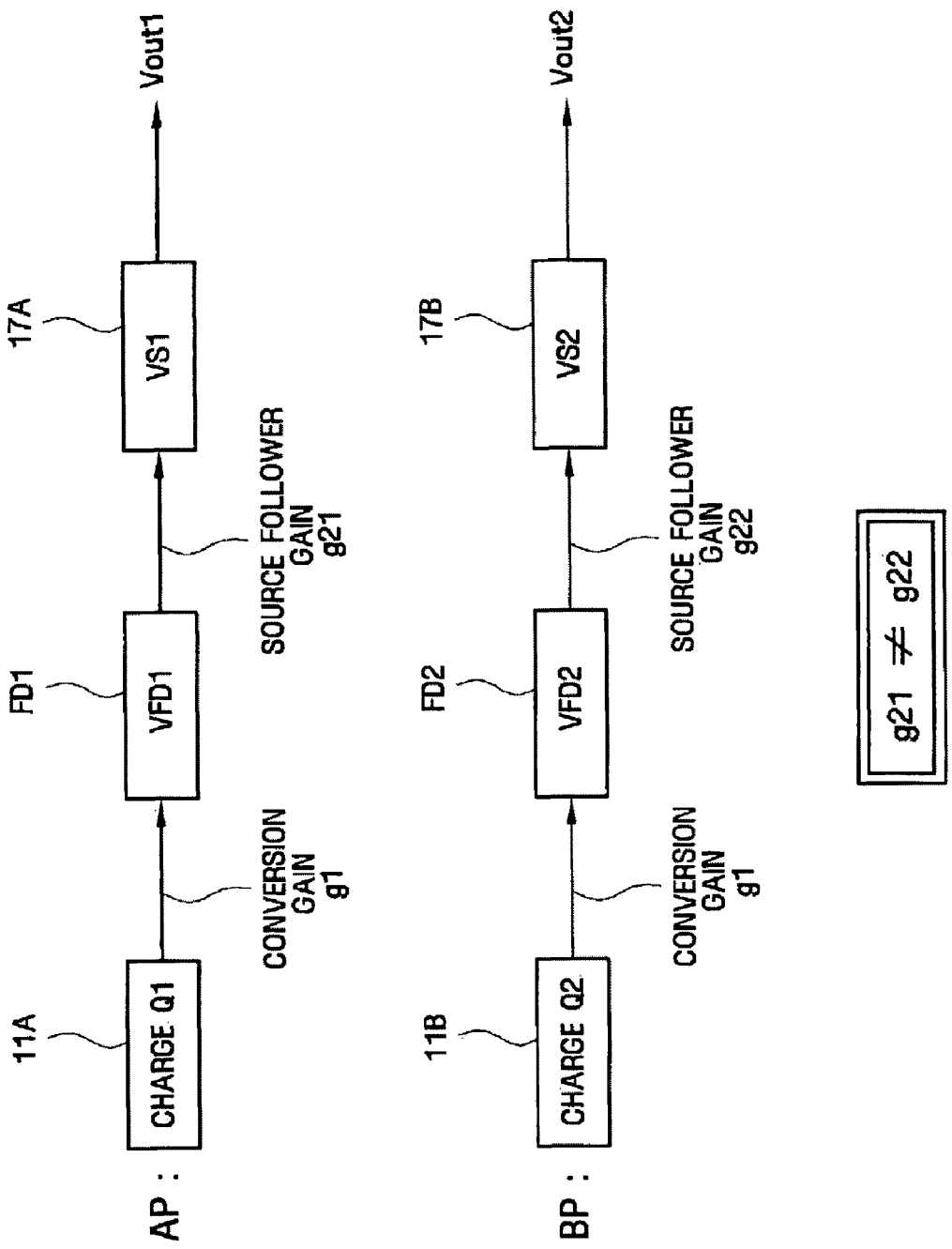
FIG. 3 shows signal paths through the active and black pixels of FIG. 2, according to an embodiment of the present invention.
Figure 4A:
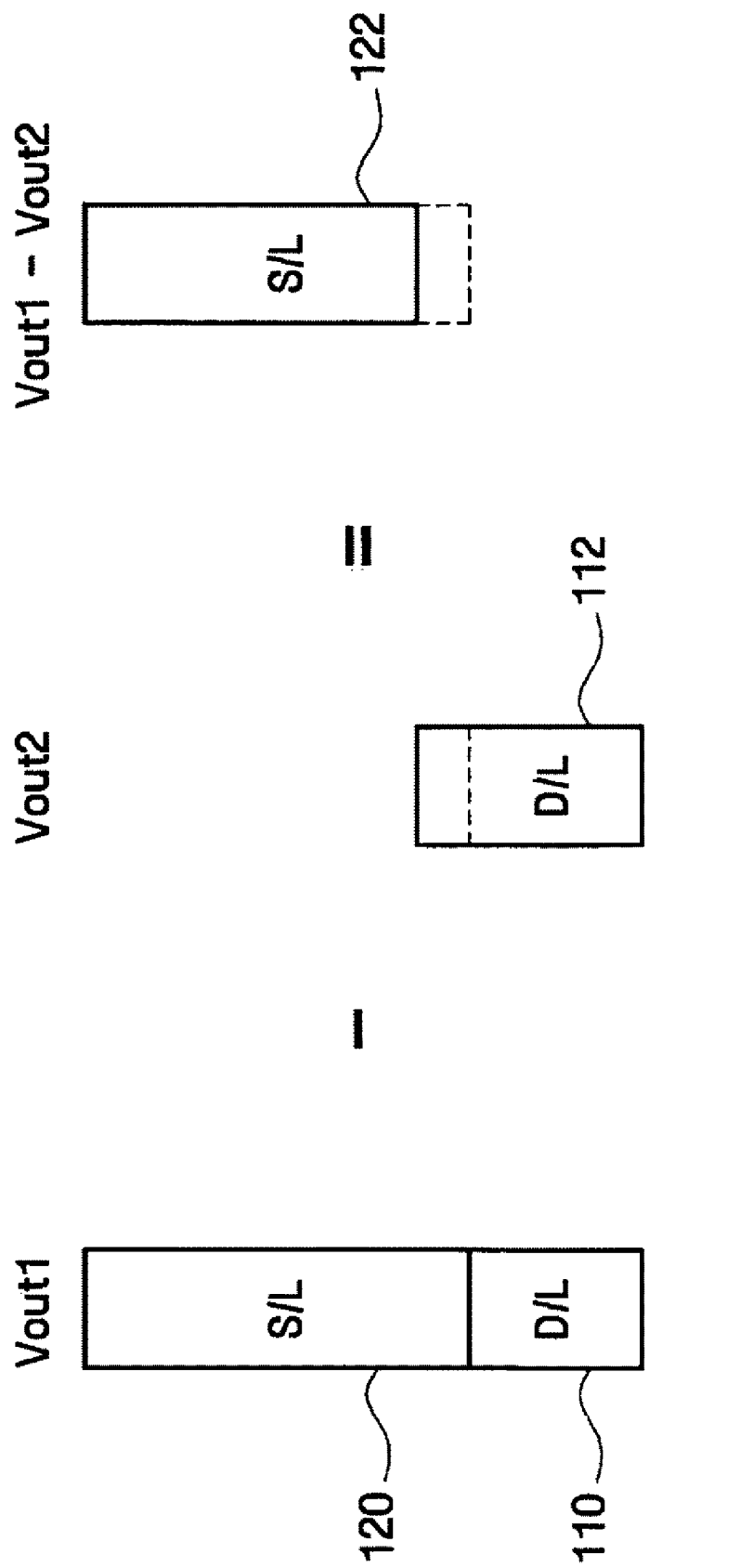

FIG. 3 shows signal paths through the active and black pixels AP and BP of FIG. 2, according to an embodiment of the present invention. FIGS. 4A, 4B, and 4C illustrate signal levels comprising the first and second output voltage signals Vout1 and Vout2 generated by active and black pixels of an image sensor.

For the active pixel AP, FIG. 3 illustrates a first charge Q1 generated by the first photoelectric converter 11A and transmitted to the first floating diffusion node FD1 to generate a voltage VFD1 thereon with a conversion gain g1. In addition in the active pixel AP, the voltage VFD1 at the first floating diffusion node FD1 is amplified by the first source-follower transistor 17A to generate the first source voltage VS1 with a first source-follower gain g21 (i.e., an example first signal gain). The first source voltage VS1 is transferred to the output line to generate the first output voltage signal Vout1.

For the black pixel BP, FIG. 3 illustrates a second charge Q2 generated by the second photoelectric converter 11B and transmitted to the second floating diffusion node FD2 to generate a voltage VFD2 thereon with the conversion gain g1. In addition in the black pixel BP, the voltage VFD2 at the second floating diffusion node FD2 is amplified by the second source-follower transistor 17B to generate the second source voltage VS2 with a second source-follower gain g22 (i.e., an example second signal gain). The second source voltage VS2 is transferred to the output line to generate the second output voltage signal Vout2.

The conversion gain g1 (G1 below) may be expressed by Equation (1) below:

$$G1 \alpha \Delta VFD/Q \qquad \text{Equation (1)}$$

In Equation (1) above, ΔVFD indicates a variation in a voltage VFD of the detection node FD1 or FD2, and Q indicates the amount of charge Q1 or Q2. Referring to Equation (1), the conversion gain G1 is proportional to the voltage variation ΔVFD and is indirectly proportional to the amount of charge Q. That is, the conversion gain G1 indicates the level of voltage variation ΔVFD due to the amount of charge Q.

The source-follower gain g21 or g22 (G2 below) may be expressed by Equation (2) below:

$$G2 \alpha \Delta VS/\Delta VFD$$

In Equation (2) above, ΔVFD indicates a voltage variation VFD at the detection node FD1 or FD2, and ΔVS indicates a variation in the source voltage VS1 or VS2. The source-follower gain G2 indicates the level of the source voltage variation ΔVS due to the voltage variation ΔVFD at the detection node FD1 or FD2. That is, the greater the source-follower gain G2, the greater the voltage variation ΔVFD at the detection node FD1 or FD2 is reflected in the source voltage VS.

Accordingly, each of the first and second output voltage signals Vout1 and Vout2 depends on the respective conversion gain G1 and the respective source-follower gain G2 through the respective signal paths. Each conversion gain G1 and each respective source-follower gain G2 may depend on the layout of the image sensor 1, the characteristics of the devices in the respective signal paths, and the operating conditions of the image sensor 1.

In FIG. 3, the first output voltage signal Vout1 generated by the active pixel AP depends on the conversion gain g1 and the first source-follower gain g21. Similarly, the second output voltage signal Vout2 generated by the black pixel BP depends on the conversion gain g1 and the second source-follower gain g22.

In an embodiment of the present invention, at least one of the first and second source-follower gains g21 and g22 are adjusted to equalize the dark signal levels in the active and black pixels AP and BP. According to such adjustment, the first and second source-follower gains g21 and g22 may be different from each-other (i.e., g21≠g22), as described in more detail with reference to FIGS. 4A, 4B, and 4C.

FIGS. 4A and 4C illustrate signal levels of the first and second output voltage signals Vout1 and Vout2 when the first and second source-follower gains g21 and g22 are equal. FIG. 4A shows the respective dark signal level of the black pixel BP being greater than the respective dark signal level of the active pixel AP. FIG. 4C shows the respective dark signal level of the black pixel BP being less than the respective dark signal level of the active pixel AP.

FIG. 4B illustrates signal levels of the first and second output voltage signals Vout1 and Vout2 when the first and second source-follower gains g21 and g22 are adjusted such that the respective dark signal level of the black pixel BP is substantially equal to the respective dark signal level of the active pixel AP. For example, the first and second source-follower gains g21 and g22 may be adjusted to be unequal in FIG. 4B.

Referring to FIGS. 3 and 4A, the first output voltage signal Vout1 comprises a respective dark signal level (D/L) 110 and a respective light-conversion signal level (S/L) 120. The dark signal level 110 represents an amount of charge generated from any offset and thermal charge generation, and the light-conversion signal level 120 represents an amount of charge generated by photoelectric conversion of received light. The second output voltage signal Vout2 includes a respective dark signal level 112 that represents an amount of charge generated from only any offset and thermal charge generation since the black pixel is shielded from receiving light.

Because of variability such as during fabrication processes or such as variability of parameters for the active and black pixels AP and BP, disparity between the respective dark signal levels 110 and 112 may result for the active and black pixels AP and BP. In the example of FIG. 4A, the dark signal level 112 for the black pixel BP is higher than the dark signal level 110 for the active pixel AP.

In that case, the difference (Vout1-Vout2) 122 between the first and second output voltage signals Vout1 and Vout2 is lower than the actual light-conversion signal level (S/L) 120 of the active pixel AP. Accordingly, use of such a difference (Vout1-Vout2) 122 to indicate the intensity of light received at the active pixel AP results in an image defect.

For preventing such image defect, the first and second source-follower gains g21 and g22 are adjusted to result in the respective dark signal levels in the active and black pixels AP and BP being substantially equal. For example, the first and second source-follower gains g21 and g22 are adjusted to be unequal such that the respective dark signal levels in the active and black pixels AP and BP are substantially equal.

In contrast in the prior art, the respective source-follower gains of the active and black pixels are designed to be substantially equal.

For example, the second source-follower gain g22 of the black pixel BP is adjusted to be less than the first source-follower gain g21 of the active pixel AP, when the dark signal level of the black pixel BP is higher than the dark signal level of the active pixel with the first and second source-follower gains g21 and g22 being equal. In that case, when the second source-follower gain g22 of the black pixel BP is adjusted to be less than the first source-follower gain g21 of the active pixel AP, the respective dark signal levels for the active and black pixels AP and BP are substantially equal, as illustrated in FIG. 4B.

Referring to FIG. 4B, when the second source-follower gain g22 is adjusted to be less than the first source-follower gain g21, a respective dark signal level 114 of the second voltage signal Vout2 is decreased to be substantially equal to the respective dark signal level 110 of the first voltage signal Vout1. Referring to FIGS. 4B and 11, when the ADLC 90 subtracts Vout1 from Vout2, the difference (Vout1-Vout2) 124 between the first and second output voltage signals Vout1 and Vout2 represents the actual light-conversion signal level (S/L) 120 of the active pixel AP.

FIG. 4C shows the scenario when a respective dark signal level 116 of the second output voltage signal Vout2 is lower than a respective dark signal level 110 of the first voltage signal Vout1, before adjustment of the first and second source-follower gains g21 and g22. In that case, the first and second source-follower gains g21 and g22 are adjusted such that the second source-follower gain g22 is higher than the first source-follower gain g21. With such an adjustment, the dark signal levels of the active and black pixels AP and BP become substantially equal, as illustrated in FIG. 4B.

Figure 5A:
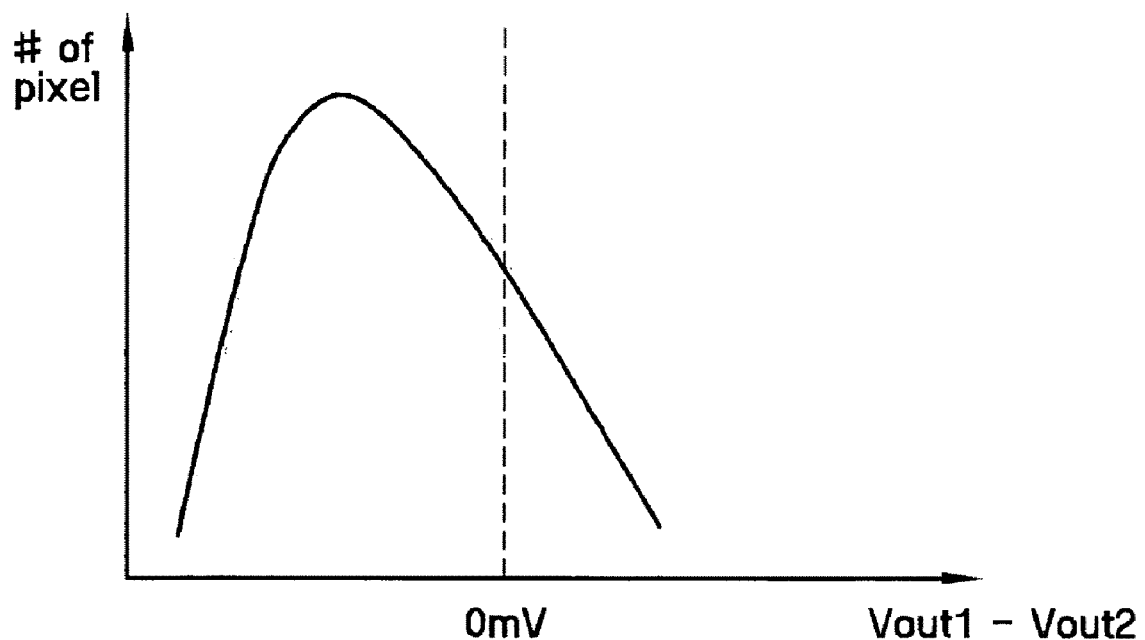
FIGS. 5A and 5B illustrate distribution of the number of pixels versus the difference of the first and second output voltage signals in an image sensor.
Figure 5B:
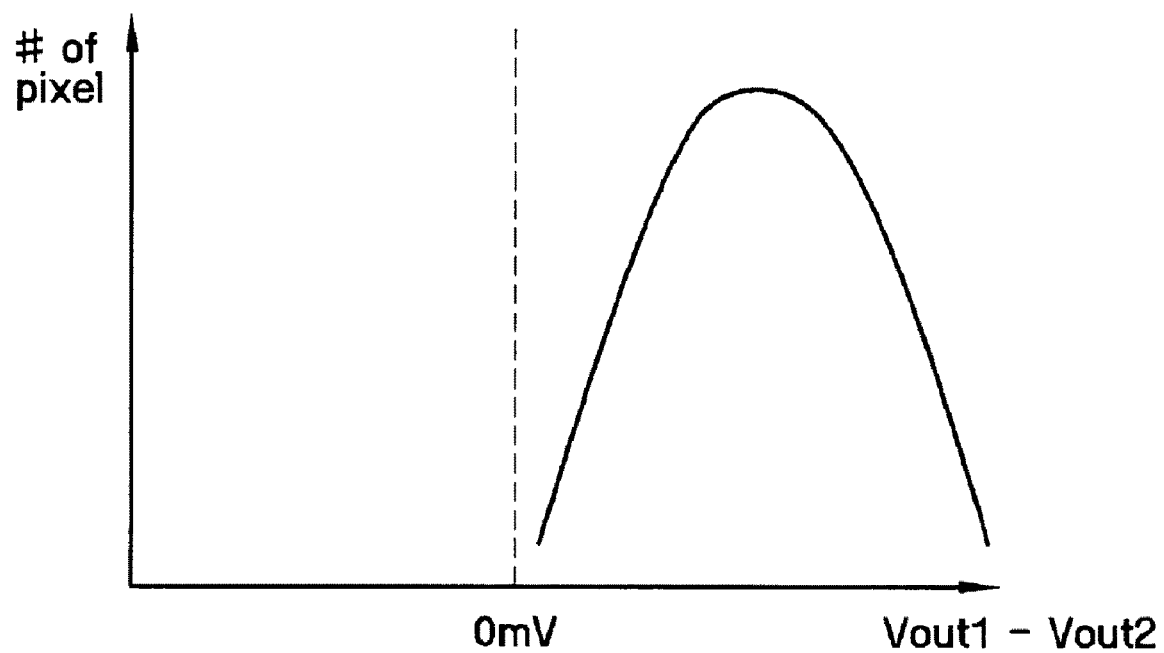

FIGS. 5A and 5B show a plot of the number of pixels versus the difference (Vout1-Vout2) between the first and second output voltage signals Vout1 and Vout2 when no light is incident to the pixel array of FIG. 1. FIG. 5A illustrates the case of FIG. 4A when the dark signal level of the second output voltage signal Vout2 is higher than the dark signal level of the first output voltage signal Vout1 in a majority of the pixels of the pixel array. FIG. 5B illustrates the case of FIG. 4C when the dark signal level of the second output voltage signal Vout2 is less than the dark signal level of the first output voltage signal Vout1 in a majority of the pixels of the pixel array.

Various methods for adjusting the first and second source-follower gains g21 and g22 is now described in more detail with reference to FIGS. 6, 7, 8, and 9.

Figure 6:
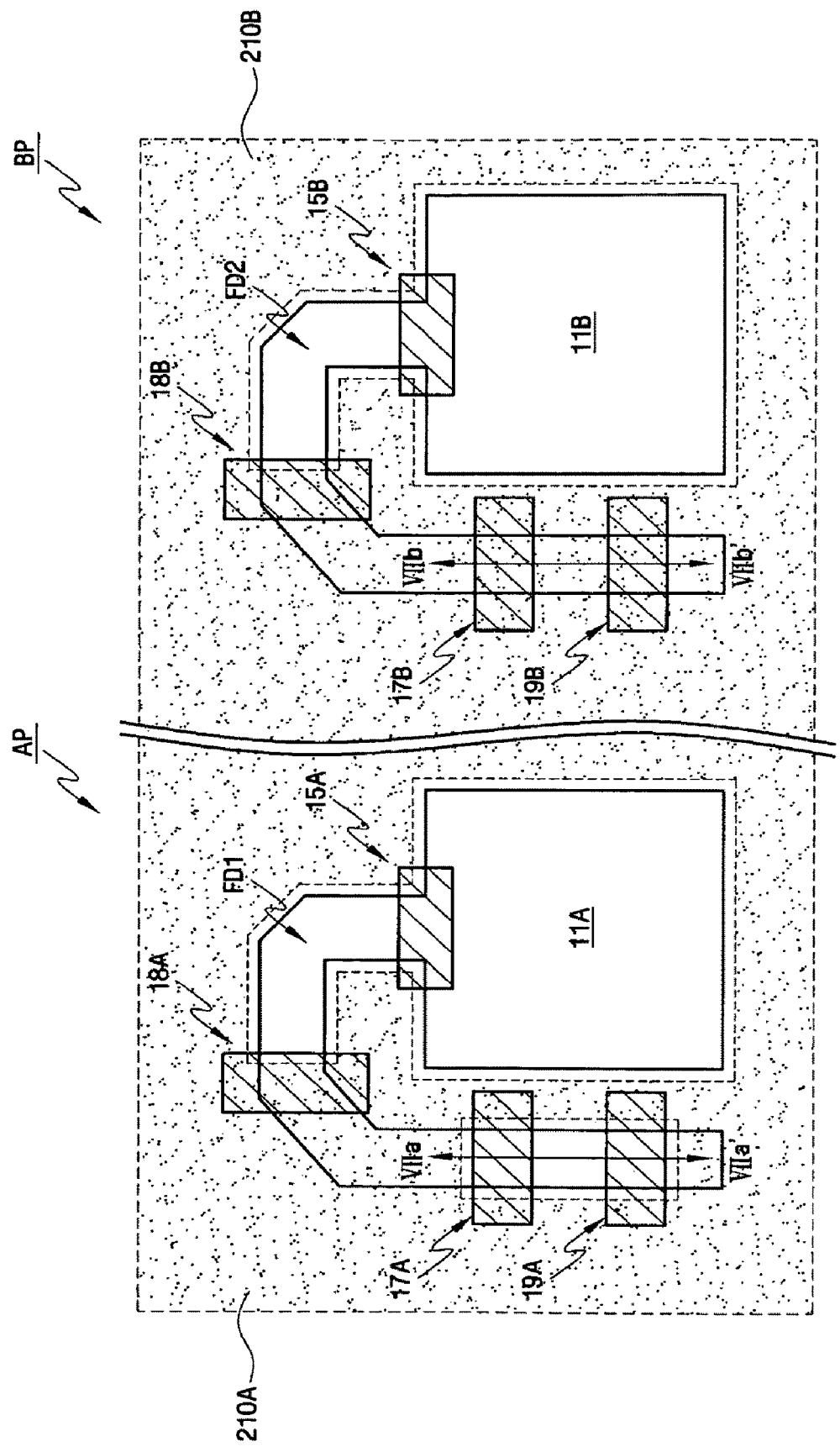
FIG. 6 illustrates a layout of an image sensor according to an embodiment of the present invention.
Figure 7:
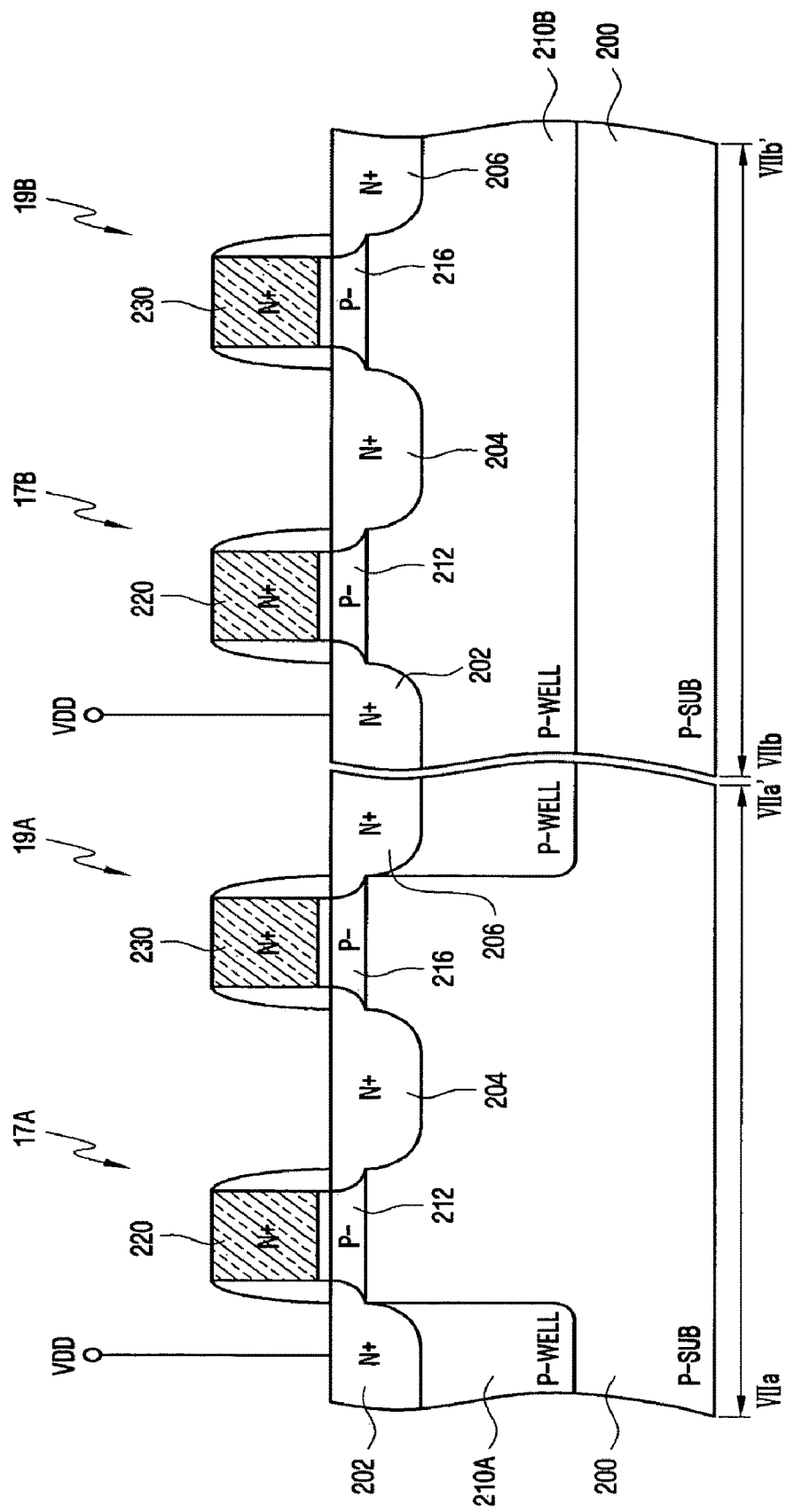
FIGS. 7, 8, and 9 illustrates cross-sectional views taken along lines VIIa-VIIa' and VIIb-VIIb' of FIG. 6, according to various embodiments of the present invention.

FIG. 6 illustrates an example layout of the active pixel AP and the black pixel BP in the image sensor 1 of FIG. 1, according to an embodiment of the present invention. FIG. 7 illustrates a cross-sectional view along lines VIIa-VIIa' and VIIb-VIIb' of FIG. 6. However, the layout of FIG. 6 is exemplary, and the present invention is not restricted thereto. Elements having the same reference number in FIGS. 2 and 6 refer to elements having similar structure and/or function.

Referring to FIGS. 6 and 7, an active pixel region and an optical black region are defined by forming electrical isolation structures such as shallow trench isolations (STIs) structures in a semiconductor substrate 200 having a first conductivity type (such as P-type conductivity for example). For clarity of illustration, only one example active pixel AP of the active pixel region and only one example black pixel BP of the optical black region are illustrated in FIG. 6.

Referring to FIG. 7, a first P-well 210A having P-type conductivity is not formed under channel regions 212 and 216 of the first source-follower transistor 17A and the first selection transistor 19A in the active pixel region. The P-well 210A is formed by implanting a P-type dopant into the substrate 200 such that a respective P-type dopant concentration of the P-well 210A is higher than a respective P-type dopant concentration of the substrate 200.

In addition, the first P-well 210A is also not formed under the first photoelectric converter 11A, the first transmission transistor 15A, and the first detection node FD1. In that case, the first photoelectric converter 11A, the first transmission transistor 15A, the first detection node FD1, and portions of the first source-follower transistor 17A and the first selection transistor 19A are formed on portions of the substrate 200 where the first P-well 210A is not formed. In an example embodiment of the present invention, the first reset transistor 18A is formed on the first P-well 210A.

Specifically, a volume of a depletion region of the first photoelectric converter 11A formed on the first P-well 210A may be less than a volume of a depletion region of the first photoelectric converter 11A formed on a portion of the substrate 200 where the first well 210A is not formed. The greater volume of the depletion region in the photoelectric converter 11A has higher efficiency of photoelectric conversion. Thus, the first photoelectric converter 11A is formed on the substrate 200 and not on the first P-well 210A for maximized efficiency of photoelectric conversion.

Further referring to FIG. 7, a second P-well 210B of the first conductivity type is formed under the second reset transistor 18B, the second source-follower transistor 17B, and the second selection transistor 19B in the black pixel region. The P-well 210B is formed by implanting a P-type dopant into the substrate 200 such that a respective P-type dopant concentration of the P-well 210B is higher than a respective P-type dopant concentration of the substrate 200. However, the second photoelectric converter 11B, the second transmission transistor 15B, and the second detection node FD2 are not formed in the P-well 210B and are formed instead on portions of the substrate 200 where the P-well 210B is not formed.

A source-follower gain of a source-follower transistor is inversely proportional to a body effect coefficient γ that is proportional to a dopant concentration $N_B$ of the body having the channel formed therein. Accordingly in FIG. 7, the first source-follower gain g21 of the first source-follower transistor 17A having the channel 212 formed in the lower doped substrate 200 is higher than the second source-follower gain g22 of the second source-follower transistor 17B formed in the higher doped P-well 210B. In the case of FIG. 4A, adjusting the second source-follower gain g22 to be lower than the first source-follower gain g21 results in the difference (Vout1-Vout2) between the first and second output voltage signals Vout1 and Vout2 more accurately representing the actual light-conversion signal level (S/L) of the active pixel AP.

Since the second selection transistor 19B is formed near the second source-follower transistor 17B with a shared drain/source region 204, the second selection transistor 19B is also formed on the P-well 210B in the black pixel region for easy manufacture of the image sensor 1.

Referring to FIG. 6, the active pixel AP and the black pixel BP have a substantially same layout for equalizing the dark signal levels for the active and black pixels AP and BP. Specifically, charge is thermally generated and accumulated on the surface of the first photoelectric converter 11A, between the gate of the first transmission transistor 15A and the substrate 200, and along the boundaries of a STI structure. If the active pixel AP and the black pixel BP have different layouts, the respective dark signal level for the active pixel AP may be considerably different from the respective dark signal level for the black pixel BP.

The transistors 17A, 19A, 17B, and 19B are enhancement NMOSFETs (N-channel metal oxide semiconductor field effect transistors) in an example embodiment of the present invention. Thus, drain/source regions 202, 204, and 206 of such NMOSFETs 17A, 19A, 17B, and 19B have N− type conductivity. The channels 212 and 216 of such NMOSFETs 17A, 19A, 17B are formed to have a lightly doped P-type conductivity for increased threshold voltages of the NMOSFETs 17A, 19A, 17B, and 19B. The NMOSFETs 17A, 19A, 17B, and 19B have gates 220 and 230 with N+ type conductivity.

Figure 8:
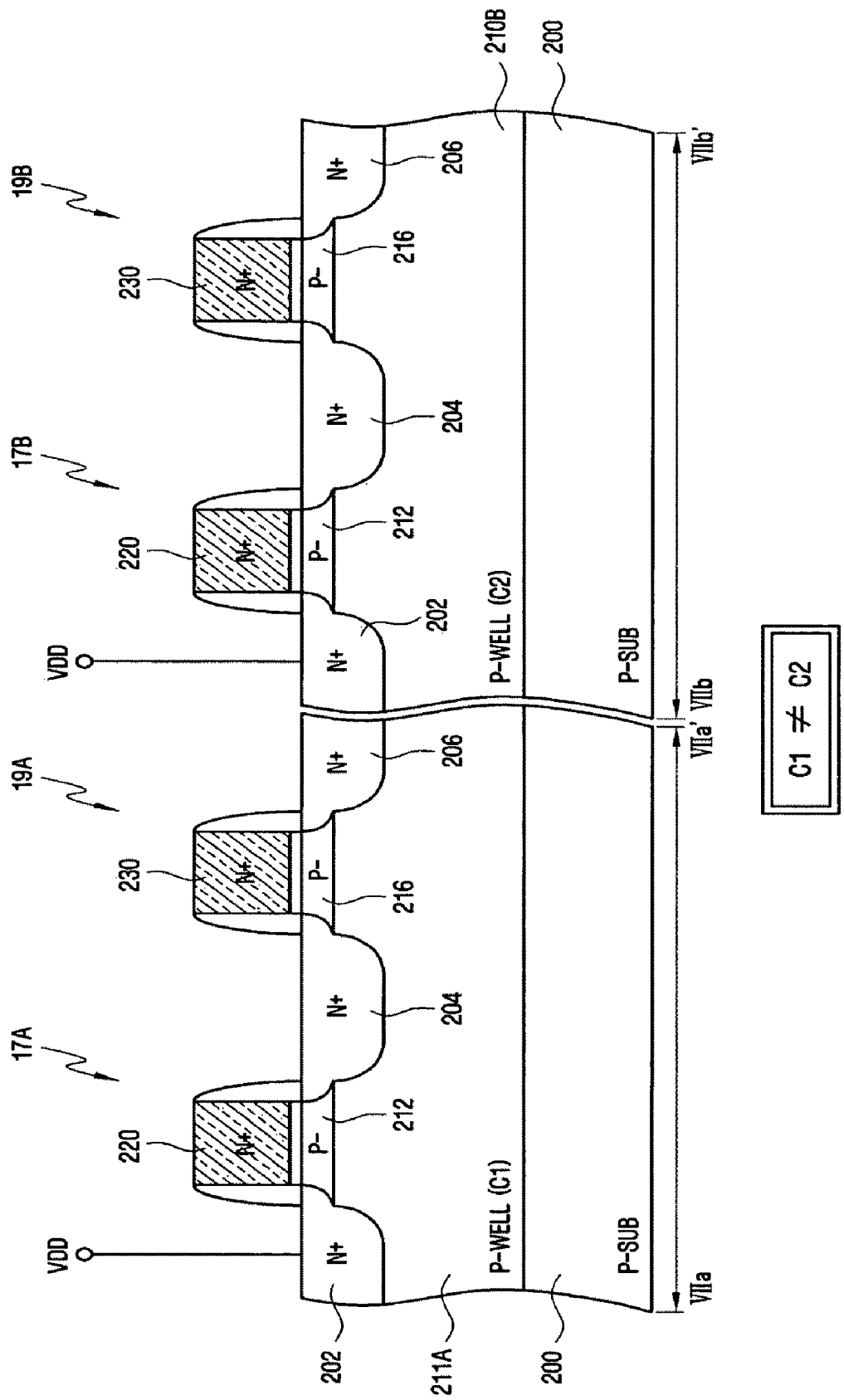

FIG. 8 illustrates a cross-sectional view along lines VIIa-VIIa' and VIIb-VIIb' of FIG. 6, according to another embodiment of the present invention. Referring to FIG. 8, the first source-follower transistor 17A and the first selection transistor 19A are formed on a first P-well 211A formed in the substrate 200, in contrast to FIG. 7. In addition, the second source-follower transistor 17B and the second selection transistor 19B are formed on the second P-well 210B formed in the substrate 200.

Further referring to FIG. 8, a first dopant concentration C1 of the first P-well 211A is different from a second dopant concentration C2 of the second P-well 210B. In an example embodiment of the present invention, the second dopant concentration C2 is higher than the first dopant concentration C1. As described above, a source-follower gain of a source-follower transistor is inversely proportional to a body effect coefficient γ that is proportional to the dopant concentration $N_B$ of the body of the source-follower transistor. Thus when the second dopant concentration C2 is higher than the first dopant concentration C1 the second source-follower gain g22 of the second source-follower transistor 17B is less than the first source-follower gain g21 of the first source-follower transistor 17A.

Figure 9:
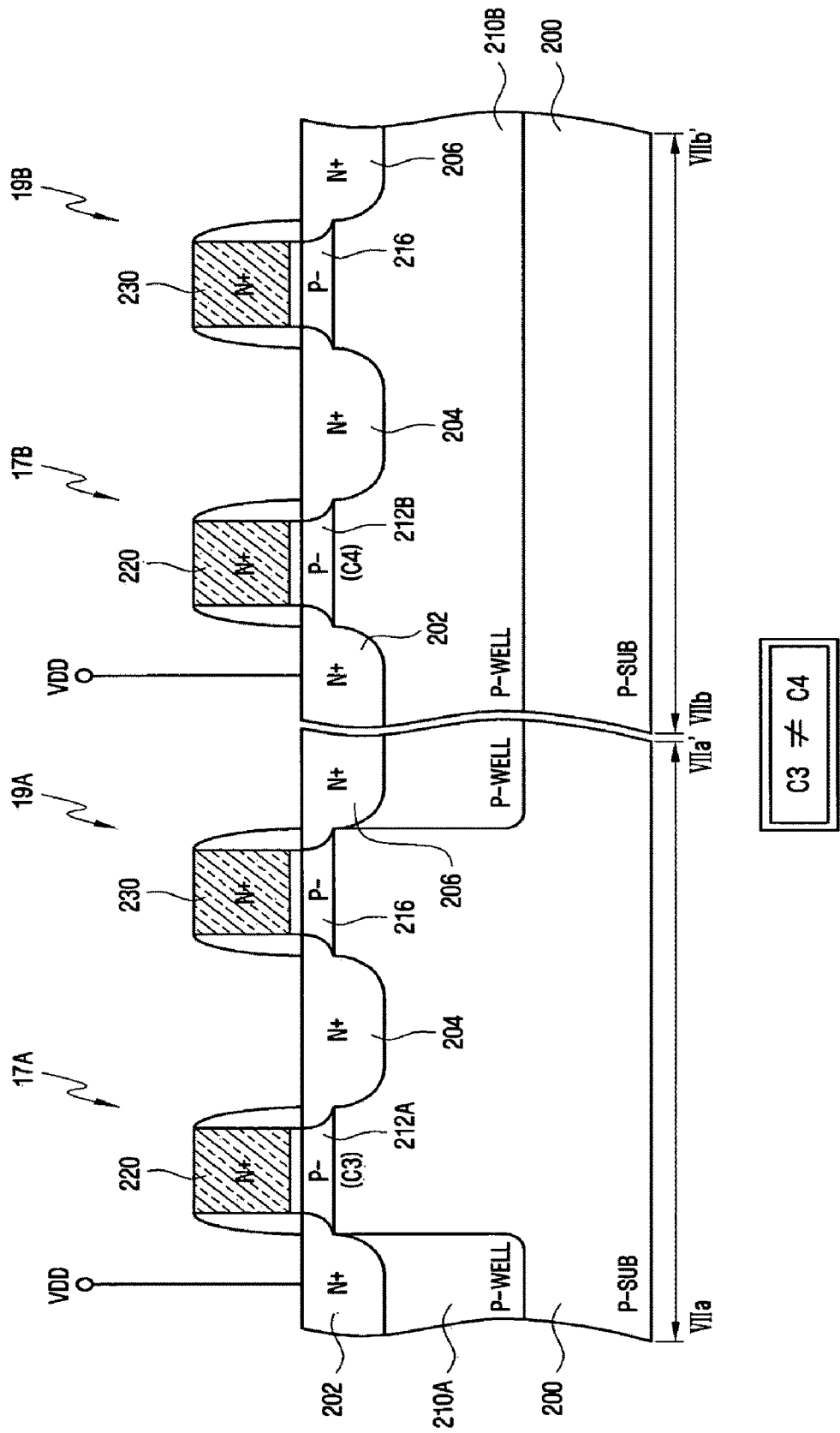

FIG. 9 illustrates a cross-sectional view along lines VIIa-VIIa' and VIIb-VIIb' of FIG. 6, according to another embodiment of the present invention. Referring to FIG. 9, a respective channel 212A of the first source-follower transistor 17A has a first P-type dopant concentration C3 that is different from a second P-type dopant concentration C4 of a respective channel 212B of the second source-follower transistor 17B. With such different channel dopant concentrations C3 and C4, the second source-follower gain g22 of the second source-follower transistor 17B may be adjusted to be less than the first source-follower gain g21 of the first source-follower transistor 17A.

Various techniques for adjusting the second source-follower gain g22 of the second source-follower transistor 17B to be less than the first source-follower gain g21 of the first source follower 17A have been described above with reference to FIGS. 6, 7, 8, and 9. However, the present invention is not restricted thereto, and the present invention may be practiced with other techniques for adjusting the first and second source-follower gains g21 and g22 to be different. For example, gate insulation layers of the first and second source-follower transistors 17A and 17B may be formed with different thicknesses such that the first and second source-follower gains g21 and g22 are different.

Figure 10:
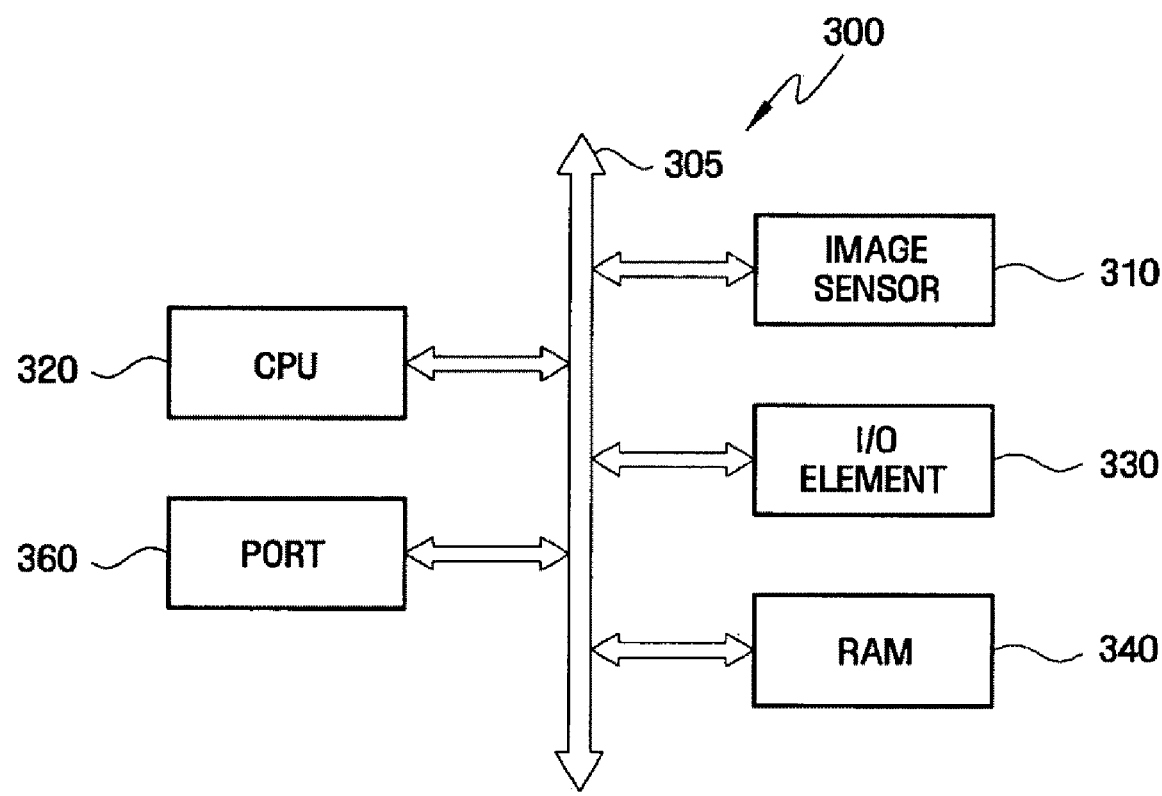
FIG. 10 illustrates a block diagram of a processor-based system including an image sensor according to an embodiment of the present invention.

FIG. 10 shows a block diagram of a processor-based system 300 including a CMOS image sensor 310 that may be the image sensor 1 of FIG. 1 according to an embodiment of the present invention. Referring to FIG. 10, the processor-based system 300 processes an image sensed by the CMOS image sensor 310. The processor-based system 300 may be a computer system, a camera system, a scanner, a mechanized clock system, a navigation system, a video phone, a surveillance system, an auto-focusing system, a tracking system, a performance-monitoring system, or an image stabilization system, but the present invention is not restricted thereto.

The processor-based system 300 such as a computer system includes a central processing unit (CPU) 320 such as a microprocessor which communicates with an input/output (I/O) element 330 via a bus 305. The CMOS image sensor 310 communicates within the processor-based system 300 via the bus 305 or another communication link. The processor-based system 300 also includes a random access memory (RAM) 340 and/or a port 260 which communicate with the CPU 320 via the bus 305.

The port 360 may be coupled to a video card, a sound card, a memory card, or a universal serial bus (USB) card, or may communicate with a system other than the processor-based system 300. The CMOS image sensor 310 may be integrated with a CPU, a digital signal processor (DSP), or a microprocessor. The CMOS image sensor 310 may also be integrated with a memory. The CMOS image sensor 310 and the processor-based system 300 may be formed as separate integrated chips.

While the present invention has been particularly shown and described with reference to an exemplary embodiment thereof, it will be understood by those of ordinary skill in the art that various changes in form and details may be made therein without departing from the spirit and scope of the present invention as defined by the following claims.

The present invention is limited only as defined in the following claims and equivalents thereof.

What is claimed is:

1. An image sensor comprising:
   an active pixel having a first transistor with a first signal gain and having a first dark signal level in a pixel array; and
   a black pixel having a second transistor with a second signal gain and having a second dark signal level in the pixel array;
   wherein the first and second signal gains of the first and second transistors within the pixel array are adjusted to be different such that the first and second dark signal levels are substantially equal.

2. The image sensor of claim 1, wherein the second signal gain is adjusted to be different from the first signal gain such that the first and second dark signal levels are substantially equal.

3. The image sensor of claim 2, wherein the second signal gain is adjusted to be less than the first signal gain when the second dark signal level is higher than the first dark signal level before the adjustment of at least one of the signal gains.

4. The image sensor of claim 2, wherein the second signal gain is adjusted to be higher than the first signal gain when the second dark signal level is lower than the first dark signal level before the adjustment of at least one of the signal gains.

5. The image sensor of claim 2, wherein the first signal gain is a first source-follower gain of a first source-follower transistor of the active pixel, and the second signal gain is a second source-follower gain of a second source-follower transistor of the black pixel.

6. The image sensor of claim 5, wherein the first source-follower transistor is formed in a semiconductor substrate, and wherein the second source-follower transistor is formed in a well within the semiconductor substrate.

7. The image sensor of claim 6, wherein the semiconductor substrate has a first dopant concentration that is different from a second dopant concentration of the well.

8. The image sensor of claim 7, wherein the second dopant concentration is higher than the first dopant concentration with the semiconductor substrate and the well having P-type conductivity, and wherein the first and second source-follower transistors are N-channel field effect transistors.

9. The image sensor of claim 5, wherein the first source-follower transistor is formed in a first well with a first dopant concentration, and wherein the second source-follower transistor is formed in a second well with a second dopant concentration, and wherein the first and second dopant concentrations are different.

10. The image sensor of claim 9, wherein the second dopant concentration is higher than the first dopant concentration with the first and second wells having P-type conductivity, and wherein the first and second source-follower transistors are N-channel field effect transistors.

11. The image sensor of claim 5, wherein the first source-follower transistor has a first channel dopant concentration that is different from a second channel dopant concentration of the second source-follower transistor.

12. The image sensor of claim 5, wherein the active pixel includes:
   a first photoelectric converter;
   a first transmission transistor coupled between the first photoelectric converter and a first floating diffusion node at a first gate of the first source-follower transistor;
   a first selection transistor coupled between the first source-follower transistor and a first output line; and a first reset transistor coupled between the first floating diffusion node and a power voltage source, and wherein the black pixel includes:

a second photoelectric converter;

a second transmission transistor coupled between the second photoelectric converter and a second floating diffusion node at a second gate of the second source-follower transistor;

a second selection transistor coupled between the second source-follower transistor and a second output line; and a second reset transistor coupled between the second floating diffusion node and the power voltage source.

13. An image sensor comprising:

an active pixel having a first source-follower transistor with a first gain and having a first dark signal level in a pixel array; and a black pixel having a second dark signal level and including:

a semiconductor substrate of a first conductivity type;

a well of the first conductivity type formed in the semiconductor substrate; and a second source-follower transistor with a second gain in the pixel array and formed in the well, wherein the first and second signal gains of the first and second source-follower transistors within the pixel array are adjusted to be different such that the first and second dark signal levels are substantially equal.

14. The image sensor of claim 13, wherein the well and the semiconductor substrate have P-type conductivity.

15. The image sensor of claim 14, wherein the well has a higher P-type dopant concentration than the semiconductor substrate.

16. The image sensor of claim 15, wherein the first source-follower transistor is formed in the semiconductor substrate.

17. The image sensor of claim 13, wherein the second signal gain in the black pixel is lower than the first signal gain in the active pixel when the black pixel has a higher dark signal level than the active pixel with the signal gains being equal, and wherein the second signal gain in the black pixel is higher than the first signal gain in the active pixel when the black pixel has a lower dark signal level than the active pixel with the signal gains being equal.

18. The image sensor of claim 16, wherein the active pixel includes:

a first photoelectric converter;

a first transmission transistor coupled between the first photoelectric converter and a first floating diffusion node at a first gate of the first source-follower transistor of the active pixel;

a first selection transistor coupled between the first source-follower transistor and a first output line; and a first reset transistor coupled between the first floating diffusion node and a power voltage source, and wherein the black pixel includes:

a second photoelectric converter;

a second transmission transistor coupled between the second photoelectric converter and a second floating diffusion node at a second gate of the second source-follower transistor of the black pixel;

a second selection transistor coupled between the second source-follower transistor and a second output line; and a second reset transistor coupled between the second floating diffusion node and the power voltage source.

* * * * *